US008380155B1

United States Patent
De Bernardinis et al.

(10) Patent No.: US 8,380,155 B1
(45) Date of Patent: *Feb. 19, 2013

(54) METHOD AND APPARATUS FOR FILTERING

(75) Inventors: Fernando De Bernardinis, Pavia (IT); Rinaldo Castello, Arcore (IT)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/434,920

(22) Filed: Mar. 30, 2012

Related U.S. Application Data

(63) Continuation of application No. 12/372,215, filed on Feb. 17, 2009, now Pat. No. 8,165,555.

(60) Provisional application No. 61/031,871, filed on Feb. 27, 2008.

(51) Int. Cl.
*H04B 1/10* (2006.01)

(52) U.S. Cl. ........................................ 455/307; 327/552

(58) Field of Classification Search .......... 327/551–559; 455/280, 307
See application file for complete search history.

(56) References Cited

U.S. PATENT DOCUMENTS

| 5,917,368 | A  | * | 6/1999 | Tan et al. ...................... 327/543 |
| 5,930,695 | A  |   | 7/1999 | Yamaguchi et al. |
| 6,570,412 | B2 |   | 5/2003 | Yamazaki |
| 7,196,573 | B1 |   | 3/2007 | Bailey et al. |
| 2005/0168268 | A1 | * | 8/2005 | Pan .............................. 327/538 |

OTHER PUBLICATIONS

WO 9804038 Tan, Continuous-Time Filtering Method for sampled Data, 1998.*

* cited by examiner

*Primary Examiner* — Quan Tra

(57) ABSTRACT

Aspects of the disclosure can provide a second order low pass filter. The second order low pass filter can work in current domain, and have high linearity for in-band signals and out-of-band signals. The second order low pass filter can include a MOS transistor having a gate terminal, a current input terminal and a current output terminal, a first capacitor coupled between the current input terminal and a ground connection and a second capacitor coupled between the gate terminal and the current input terminal.

19 Claims, 7 Drawing Sheets

METHOD AND APPARATUS FOR FILTERING

INCORPORATION BY REFERENCE

This is a continuation of U.S. application Ser. No. 12/372,215, filed on Feb. 17, 2009, which claims the benefit of U.S. Provisional Application No. 61/031,871, "Low Power, High Linearity, Tunable Filter Topology" filed on Feb. 27, 2008, the disclosures of which are incorporated herein by reference in their entireties.

BACKGROUND

A receiving device may use various filters to select informative portions of a received signal and attenuate noise and interference portions from the received signal. For example, a digital video broadcast (DVB) receiver can include filters at the receiver front-end. The DVB receiver may receive a signal that may include DVB portions that can be transmitted according to a bandwidth assigned to a DVB standard, and out-of-band portions that can be noises and interferences due to co-existing transmissions of other standards. The filters can be used to attenuate the out-of-band portions, and select the DVB portions, before converting the received signal into a digital signal. Therefore, the filtered signal may result in a reduced error rate, and an increase digital video quality.

SUMMARY

Aspects of the disclosure can provide a second order low pass filter. The second order low pass filter can work in current domain, and have high linearity for in-band signals and out-of-band signals. Further, the second order low pass filter can be configured to be stackable to provide additionally filtering capability while consuming a reduced power. In addition, the second order low pass filter may include tunable components, thus the second order low pass filter may be adjustable to suit needs of a multi-standard system.

Aspects of the disclosure can provide a receiver. The receiver may include a signal amplifier configured to output a voltage signal in response to a received signal, a voltage to current converter configured to output a current signal in response to the voltage signal, and a filter stage. The filter stage can include at least a first low pass filter. The first low pass filter can include a MOS transistor having a gate terminal, a current input terminal and a current output terminal, a first capacitor coupled between the current input terminal and a ground connection and a second capacitor coupled between the gate terminal and the current input terminal.

The MOS transistor can be a P-type MOS transistor or an N-type MOS transistor. The filter stage can further include a bias resistor coupled between a DC reference and the gate terminal.

According to the disclosure, the low pass filter can have a transfer function:

$$H(s) = \frac{1}{1 + \frac{C_1 + C_2}{g_{m1}}s + \frac{C_1 C_2 R}{g_{m1}}s^2}$$

where $C_1$ is a capacitance of the first capacitor, $C_2$ is a capacitance of the second capacitor, $g_{m1}$ is a trans-conductance of the MOS transistor, and R is a resistance of the bias resistor. Further, a product of the resistance of the bias resistor and the trans-conductance of the MOS transistor can be kept constant for easy control of a filter characteristic.

Further, at least one of the first capacitor and the second capacitor can be tunable via a programmable capacitor array. The programmable capacitor array can include at least a capacitor cell that includes a MOS capacitor in an isolated well.

According to an embodiment of the disclosure, the filter stage can include at least a second low pass filter stacked on the first low pass filter.

According to another embodiment of the disclosure, the filter stage can include at least one differential pair. For example, the differential pair can include a second low pass filter that is paired with the first low pass filter.

According to another embodiment of the disclosure, a filter stage can include a first low pass filter, a second low pass filter and a coupling capacitor that couples the first low pass filter and the second low pass filter. Each of the first and second low pass filters can include a MOS transistor having a gate terminal, a current input terminal and a current output terminal, a capacitor coupled between the gate terminal and the current input terminal, and a bias resistor coupled between a DC reference and the gate terminal. The coupling capacitor can couple the current input terminals of the MOS transistors.

Aspects of the disclosure can also provide an electrical circuit for filtering an input current signal and outputting a low pass filtered current signal. The electrical circuit can include at least a first filter. The first filter can include a MOS transistor having a gate terminal, a current input terminal for receiving the input current signal and a current output terminal for outputting the low pass filtered current signal. Further, the first filter can include a first capacitor coupled between the current input terminal and a ground connection, a second capacitor coupled between the gate terminal and the current input terminal, and a bias resistor coupled between a DC reference and the gate terminal.

According to the disclosure, the MOS transistor can be a P-type MOS transistor or an N-type MOS transistor. Further, the first filter can have a transfer function:

$$H(s) = \frac{1}{1 + \frac{C_1 + C_2}{g_{m1}}s + \frac{C_1 C_2 R}{g_{m1}}s^2}$$

where $C_1$ is a capacitance of the first capacitor, $C_2$ is a capacitance of the second capacitor, $g_{m1}$ is a trans-conductance of the MOS transistor, and R is a resistance of the bias resistor. In addition, a product of a resistance of the bias resistor and a trans-conductance of the MOS transistor may be kept constant.

According to an aspect of the disclosure, at least one of the first capacitor and the second capacitor can be tunable via a programmable capacitor array. Further, the programmable capacitor array may include at least a capacitor cell having a MOS capacitor in an isolated well.

In an embodiment, the electrical circuit can include at least a second filter stacked on the first filter. In another embodiment, the electrical circuit can include at least a second filter configured to form a differential pair with the first filter.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
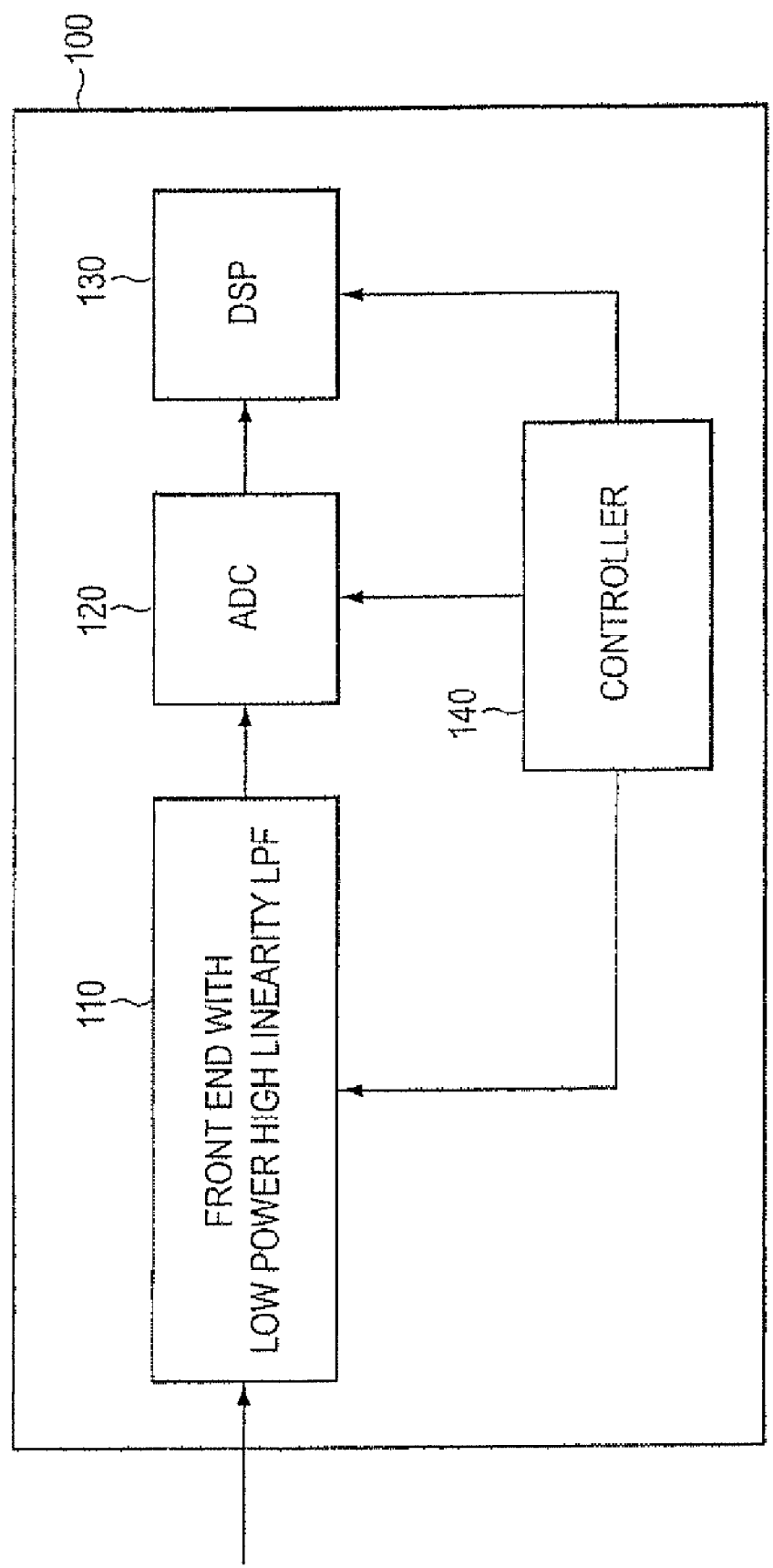
FIG. 1 shows a block diagram of a receiver example.

FIG. 1 shows a block diagram of a receiver example according to the disclosure. The receiver 100 may include a receiver front-end 110, an analog to digital converter (ADC) 120, a digital signal processor (DSP) 130 and a controller 140. Theses elements can be coupled together as shown in FIG. 1.

The receiver front-end 110 may receive an electrical signal, for example via an antenna module. The electrical signal may include portions of information directed to the receiver 100, and portions of noises and interferences due to co-existing transmissions in the air. The receiver front-end 110 may include one or more filter modules to select the portions of information and attenuate the portions of noises and interferences.

According to the disclosure, the receiver front-end 110 may include a low pass filter, which can operate in current mode. The low pass filter may be configured with regard to a standard used to transmit the portions of information. For example, the low pass filter may have a bandwidth with regard to the standard. The low pass filter can have a low in-band noise and a high linearity for both in-band portions and out-of-band portions of a signal. The in-band portions can refer to the portions having frequencies within the bandwidth of the low pass filter, and the out-band portions can refer to the portions having frequencies out of the bandwidth of the low pass filter. Further, the low pass filter can be stackable, and may consume a reduced power while providing additional filtering capability. Additionally, the low pass filter can be tunable, thus the low pass filter can be controlled to suit needs of a multi-standard system.

The receiver front-end 110 may include other analog processing components, such as amplifiers, mixers, and the like, to process the received signal. For example, the amplifiers can be used to increase signal amplitudes, and the mixers can be used to convert signal frequencies to desired ranges.

The ADC 120 may receive analog signals being processed by the receiver front-end 110, and convert the analog signals into digital signals. For example, the ADC 120 may sample the analog signals, and convert sampled signals into digital values.

The DSP 130 may use digital signal processing techniques, such as decoding, decompression, and the like, to further process the digital signals.

The controller 140 may provide control signals to configure the components of receiver 100. For example, the controller 140 may provide control signals to a tunable low pass filter in the receiver front-end 110, and configure a bandwidth of the low pass filter with regard to a standard. Thus, the receiver 100 may operate in the bandwidth of the standard.

Figure 2:
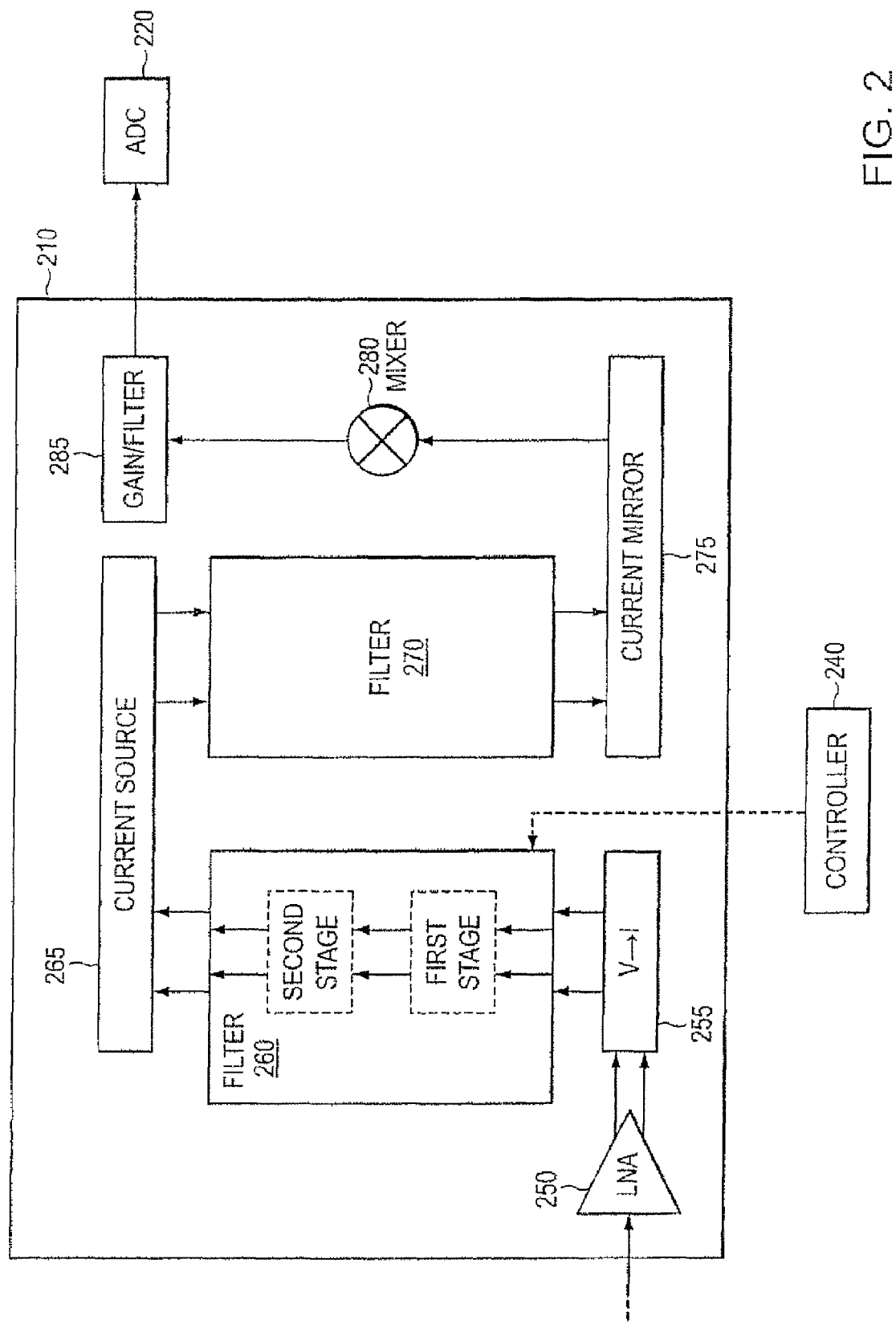
FIG. 2 shows a block diagram of a receiver front-end example.

FIG. 2 shows a block diagram of a receiver front-end example 210 according to an embodiment of the disclosure. Similar to FIG. 1, the receiver front-end 210 may be coupled with an ADC 220 and a controller 240. The receiver front-end 210 may include a low noise amplifier (LNA) module 250, a voltage to current converter module 255, a filter module 260, a current source module 265, another filter module 270, a current mirror module 275, a mixer module 280, a gain/filter module 285. These elements can be coupled as shown in FIG. 2.

The LNA module 250 can include any suitable circuitry that can be configured to receive a voltage signal, for example from an antenna module, amplify the voltage signal, and provide the amplified voltage signal to a subsequent processing circuit.

The voltage to current converter module 255 may receive the amplified voltage signal from the LNA 250, and convert the voltage signal to a current signal. The current signal can be provided to the filter module 260.

The filter module 260 can operate in a current mode. More specifically, the filter module 260 can receive the current signal from the voltage to current converter module 255, and provide a filtered current signal to a subsequent processing stage. According to the disclosure, the filter module 260 may include one or more low pass filter stages. The one or more of the low pass filter stages can be stacked together, such that a DC current may sequentially flow through the one or more of the low pass filter stages. Thus, the stackable low pass filter stages can provide additional filtering capability with substantially the same power consumption.

Further, the filter module 260 may include tunable parameters, and can be tuned to adjust a bandwidth with regard to a standard. According to the disclosure, the filter module 260 may receive control signals from the controller 240. The control signals can be used to adjust the tunable parameters to obtain an appropriate bandwidth. In an embodiment, the filter module 260 may include at least one capacitor array. The capacitor array may include multiple capacitor cells. The multiple capacitor cells can be respectively switched in or out of the filter module 260 based on the control signals. Thus, characteristics of the filter module 260 can be adjusted by scaling the capacitor array.

Additionally, the filter module 260 can have a high linearity for in-band and out-of-band signal portions and can have a low in-band noise.

The current source module 265 may receive the filtered current from the filter module 260, and may provide a current to a next module based on the filtered current. According to the disclosure, a filter module may include a limited number of stacked filter stages due to a voltage drop across each of the stacked filter stages. In order to have additional filter stages, the current source 265 can be configured to fold a current direction.

The filter module 270 may additionally filter the current signal and provide a filtered current signal to the current mirror 275. The current mirror 275 may provide a current signal corresponding to the filtered current signal.

The mixer module 280 can include any suitable circuitry, and can be configured to receive the current signal, and may convert frequencies of the current signal into an intermediate frequency (IF) range or a base-band frequency range. For example, the mixer module 280 may be coupled to an oscillator, such as a local oscillator, to receive a periodic signal. The periodic signal can be mixed with the current signal to obtain a frequency reduced signal.

The gain/filter module 285 may include a plurality of gain/filter stages. The plurality of gain/filter stages may include any suitable circuitry, such as a plurality amplifiers, filters, logic, and the like, that can further process the received signals.

During operation, for example, the filter module 260 may receive control signals from the controller 240 to adjust a filter characteristic according to a standard, thus the receiver front-end may operate according to the standard. More specifically, the LNA module 250 may amplify an input voltage signal, and provide the amplified voltage signal to the voltage to current converter module 255. The voltage to current converter module 255 can convert the amplified voltage signal to a current signal, and provide the current signal to the filter module 260. The filter module 260 may select informative portions of the current signal, and attenuate noise and interference portions of the current signal according to the filter characteristic. Then, the filtered current signal can be provided to subsequent components of the receiver front-end for further processing.

Figure 3A:
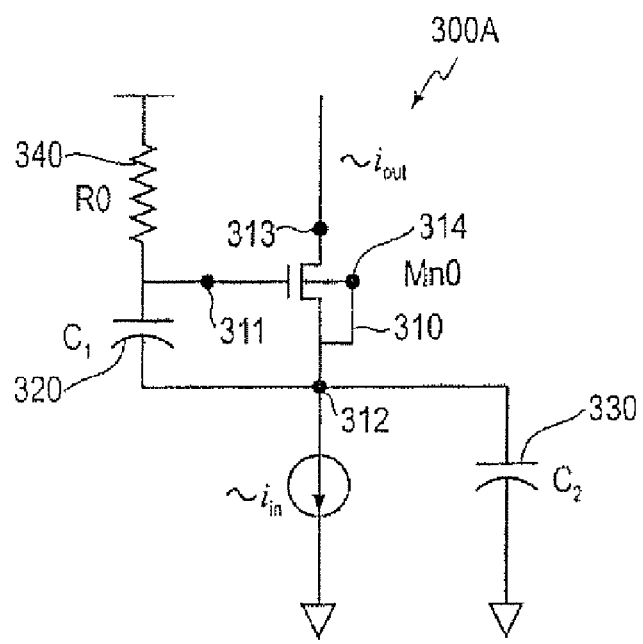
FIGS. 3A-3C show circuit diagrams of a low pass filter example according to the disclosure.

FIG. 3A show a circuit diagram of a low pass filter example 300A according to the disclosure. The low pass filter 300A may include a MOS transistor 310, a first capacitor 320, a second capacitor 330, and a resistor 340. Theses components can be coupled as shown in FIG. 3A.

The MOS transistor 310 can be an N-type MOS transistor or a P-type MOS transistor. Generally, the MOS transistor 310 may have a gate terminal 311, a current input terminal 312, a current output terminal 313, and a body terminal 314. The body terminal 314 may be tied to reduce body effect. For example, the body terminal 314 may be tied with the current input terminal 312 to reduce the body effect. The MOS transistor 310 may receive a current input from the current input terminal 312, and provide a current output from the current output terminal 313.

The first capacitor 320 may be coupled between the gate terminal 311 and the current input terminal 312. The second capacitor 330 may be coupled between the current input terminal 312 and the ground. The resistor R0 may be coupled between a power supply and the gate terminal 311 to provide a gate bias to the MOS transistor 310. The low pass filter 300 can have low noise due to its simple structure and a small number of circuit components.

According to the disclosure, the low pass filter 300A may have a second order transfer function as shown in Eq. 1:

$$H(s) = \frac{1}{1 + \frac{C_1 + C_2}{g_{m1}} s + \frac{C_1 C_2 R}{g_{m1}} s^2}$$

Eq. 1 where $C_1$ is the capacitance of the first capacitor 320, $C_2$ is the capacitance of the second capacitor 330, $g_{m1}$ is the trans-conductance of the MOS transistor 310, and R is the resistance of the resistor 340.

According to the second order transfer function Eq. 1, the low pass filter 300A may have a bandwidth characteristic related to Eq. 2

$$\omega_0 = \sqrt{\frac{g_{m1}}{C_1 C_2 R}}$$

Eq. 2

, and a shaping characteristic related to Eq. 3.

$$Q = \frac{\sqrt{C_1 C_2}}{C_1 + C_2} \sqrt{g_{m1} R}$$

Eq. 3

According to the disclosure, the low pass filter 300A may be tunable by scaling the first and second capacitors $C_1$ and $C_2$. In an embodiment, the first and second capacitors $C_1$ and $C_2$ may be implemented as capacitor arrays. The capacitor arrays can be controlled to adjust the bandwidth characteristic of the low pass filter 300A. According to another aspect of the disclosure, a product of the trans-conductance $g_{m1}$ and the resistance R can be kept constant in the low pass filter 300A, thus the shaping characteristic for the low pass filter 300A can be appropriately controlled by the first and second capacitors $C_1$ and $C_2$.

Figure 3B:
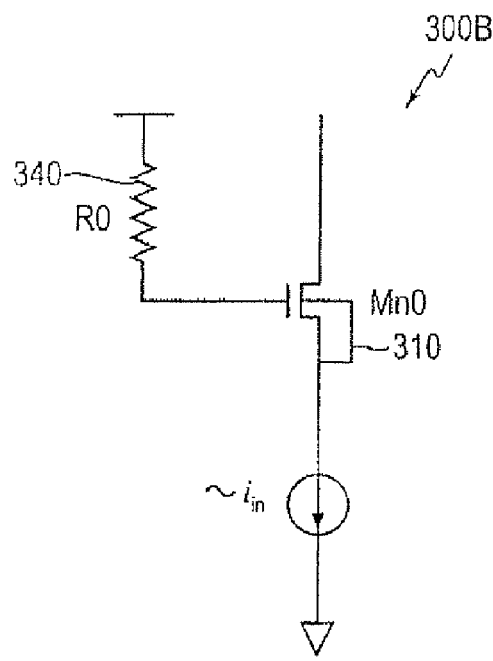

FIG. 3B shows an equivalent circuit diagram of the low pass filter 300A for in-band signal portions. The in-band signal portion can be low frequency. For the low frequency signal portions, the first capacitor 320 and the second capacitor 330 are equivalent to open connections. Thus, the MOS transistor 310 can operate in a cascade configuration. More specifically, during operation, the MOS transistor 310 can receive the in-band signal portions at the current input terminal 312, and output the in-band signal portions at the current output terminal 313. Thus, the low pass filter 300 can have high linearity for in-band signal portions.

Figure 3C:
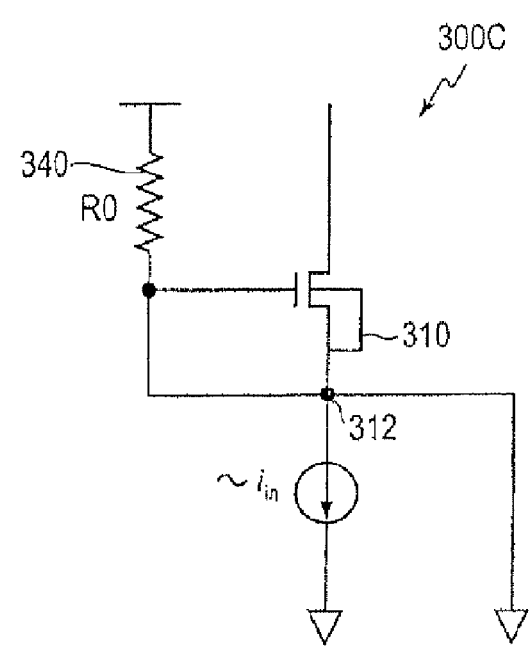

FIG. 3C shows an equivalent circuit diagram of the low pass filter 300A for out-of-band signal portions. The out-of-band signal portions can be high frequency. For high frequency signal portions, the first capacitor 320 and the second capacitor 330 can be equivalent to short connections, and can shunt away the out-of-band current. Thus, low pass filter 300 can be equivalent to an open circuit to the out-of-band portions of input current, and thus can have high linearity for the out-of-band signal portions.

Figure 4:
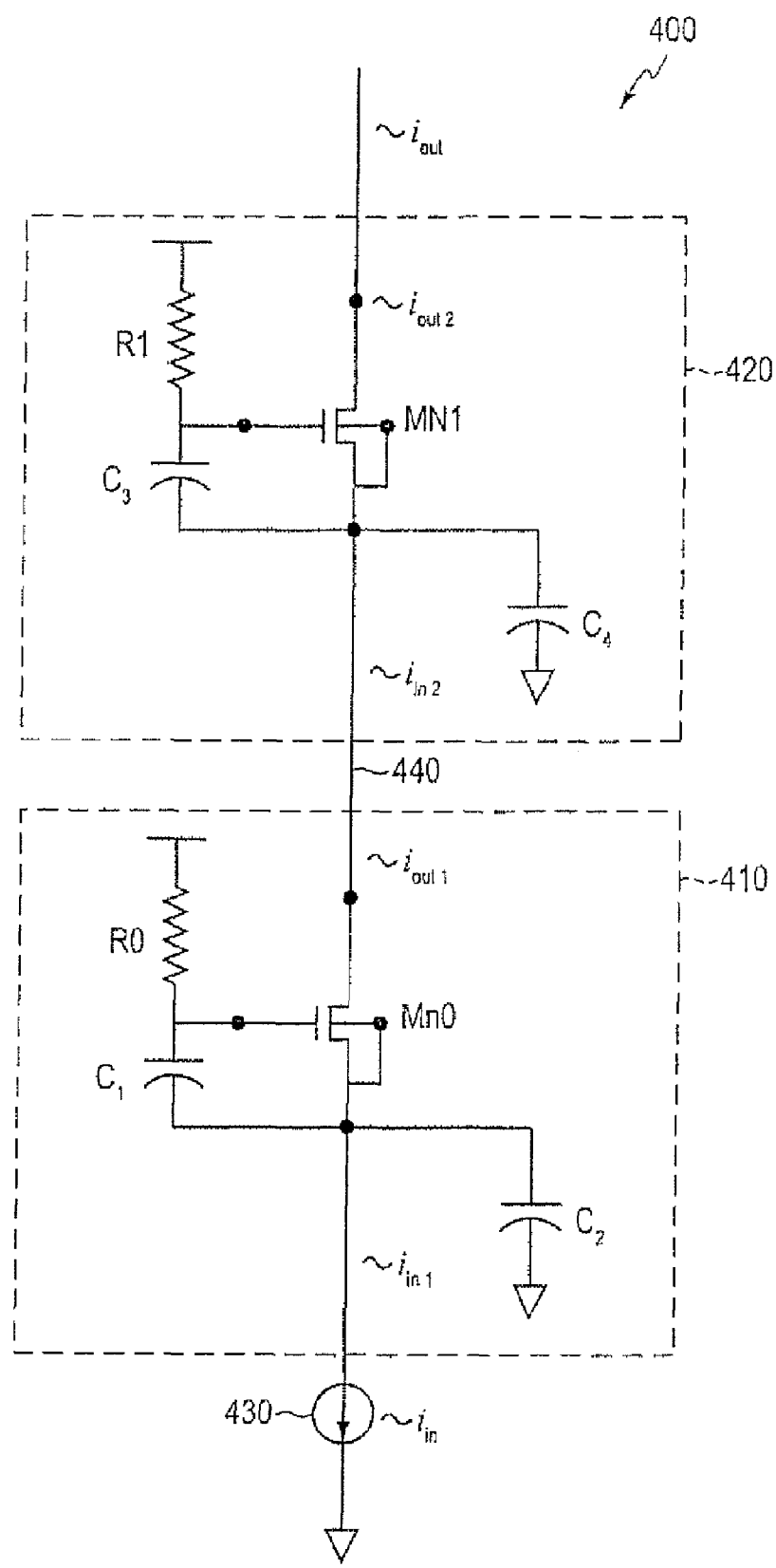
FIG. 4 shows a circuit diagram of a stacked filter module example.

FIG. 4 shows a circuit diagram of a stacked filter module example 400 according to an embodiment of the disclosure. The stacked filter module 400 may include a first stage 410 and a second stage 420. The first stage 410 and the second stage 420 can be coupled together as shown in FIG. 4.

The stacked filter module 400 may receive a current input $i_{in}$ 430, and output a current output $i_{out}$ 450. More specifically, the first stage 410 may receive a current input which is the current input $i_{in}$ 430 to the stacked filter module 400, and may output a current output $i_{out2}$. The current output $i_{out1}$ can be subsequently received by the second stage 420 as a current input $i_{in2}$. Consequently, the second stage 420 can output a current output $i_{out2}$, which can be the current output $i_{out}$ 450 of the stacked filter module 400.

According to the disclosure, at least one of the stages can be configured according to FIG. 3. In the example shown in FIG. 4, both of the first stage 410 and second stage 420 can be configured according to FIG. 3, and thus the stacked filter module 400 can enable a fourth-order filtering.

Figure 5A:
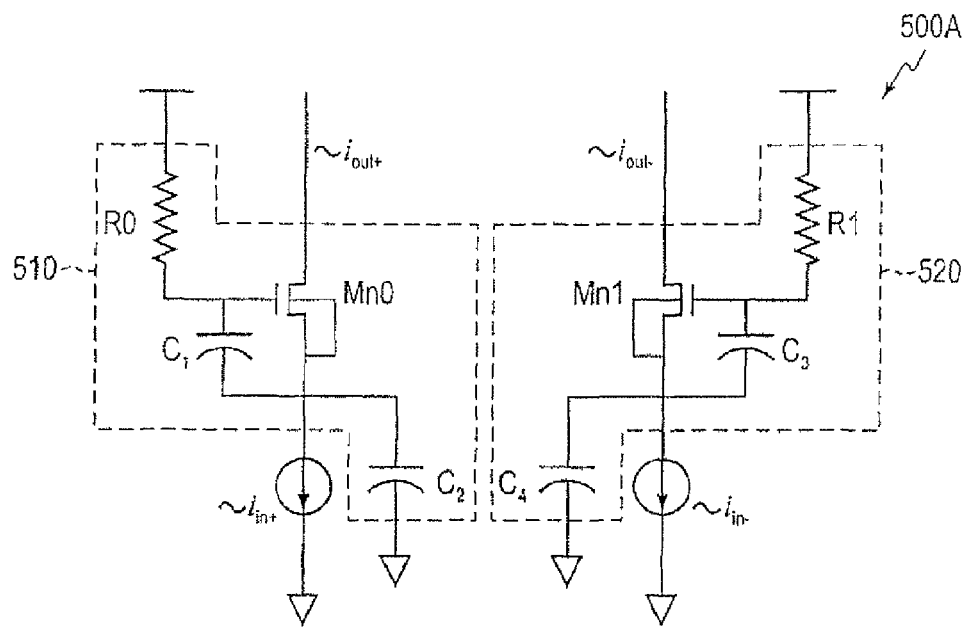
FIGS. 5A and 5B show circuit diagrams of low pass filter examples in differential configurations.
Figure 5B:
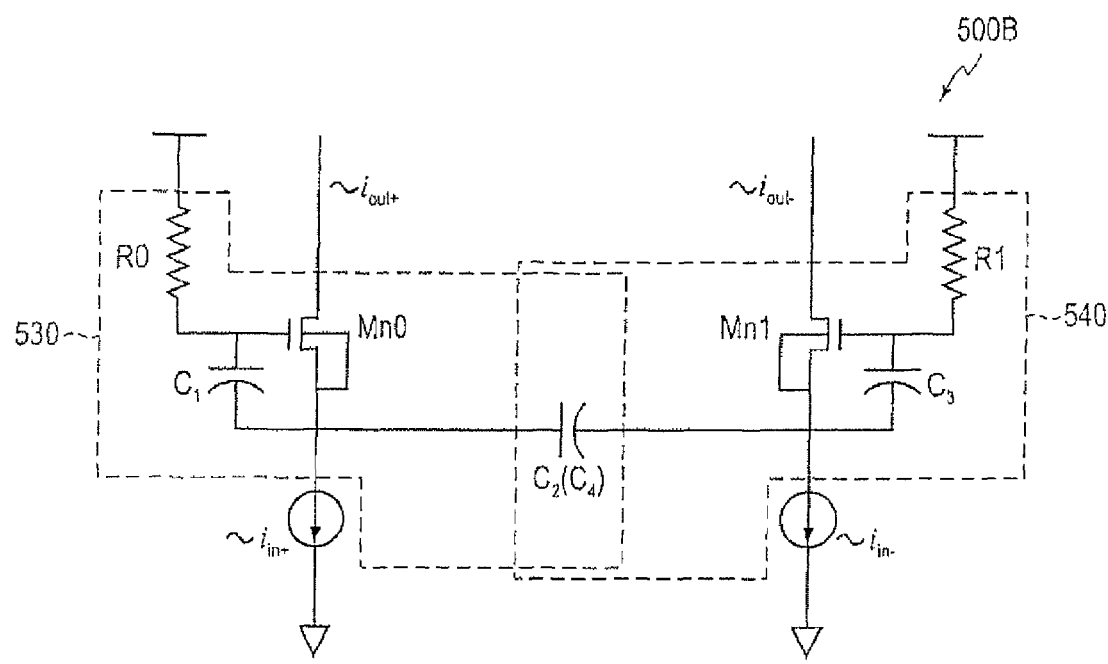

FIGS. 5A and 5B show circuit diagrams of low pass filter examples 500A and 500B in differential configurations. In FIG. 5A, the low pass filter 500A can include a pair of low pass filters including a first low pass filter 510 and a second low pass filter 520. The first low pass filter 510 and the second low pass filter 520 may include components as disclosed in FIG. 3. These components can be coupled together as shown in FIG. 5A.

Additionally, the first low pass filter 510 and the second low pass filter 520 can be configured to have substantially equivalent components. For example, the low pass filter 510 may include a NMOS transistor Mn0, a first capacitor C1, a second capacitor C2, and a resistor R0, and the low pass filter 520 can correspondingly have a NMOS transistor Mn1, a first capacitor C3, a second capacitor C4, and a resistor R1. The corresponding transistors, capacitors and resistors may be substantially the same, such as same sizes, same structures, and the like.

The first low pass filter 510 and the second low pass filter 520 may receive a pair of current inputs, and output a pair of current outputs. For example, the first low pass filter 510 may receive a positive current of the pair of current inputs, and output a positive current of the pair of current outputs; similarly, the second low pass filter 520 may receive a negative current of the pair of current inputs, and output a negative current of the pair of current outputs.

In FIG. 5B, the low pass filter 500B can also include a pair of low pass filters including a first low pass filter 530 and a second low pass filter 540. The first low pass filter 530 and the second low pass filter 540 may include similar components as disclosed in FIG. 3, and may share components, such as C2(C4). These components can be coupled together as shown in FIG. 5B.

Additionally, the first low pass filter 530 and the second low pass filter 540 can be configured to have substantially equivalent components. For example, the low pass filter 530 may include a NMOS transistor Mn0, a first capacitor C1, and a resistor R0, and the low pass filter 540 can correspondingly have a NMOS transistor Mn1, a first capacitor C3, and a resistor R1. The corresponding transistors, capacitors and resistors may be substantially the same, such as same sizes, same structures, and the like.

The first low pass filter 530 and the second low pass filter 540 may receive a pair of current inputs, and output a pair of current outputs. For example, the first low pass filter 530 may receive a positive current of the pair of current inputs, and output a positive current of the pair of current outputs; similarly, the second low pass filter 540 may receive a negative current of the pair of current inputs, and output a negative current of the pair of current outputs.

It is noted that the capacitors in the low pass filter can be implemented by various switchable capacitor techniques, such as metal-insulator-metal (MIM) capacitors with switches, metal-oxide-metal (MOM) capacitors with switches, and the like.

Figure 6:
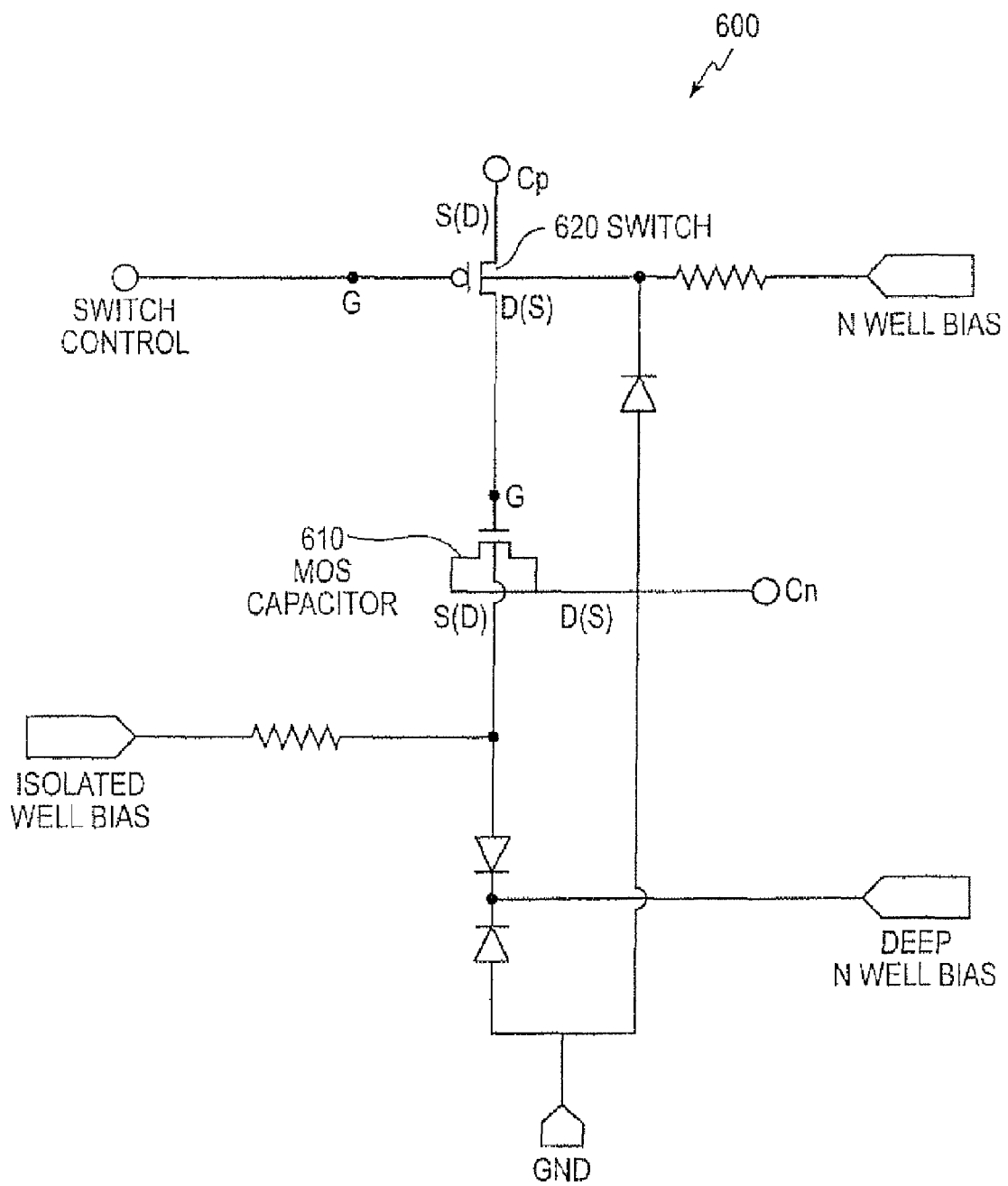
FIG. 6 shows a circuit diagram of a switchable capacitor cell example.

FIG. 6 shows a schematic diagram for a capacitor cell example 600 according to an embodiment of the disclosure. The capacitor cell 600 may provide better parasitics to extend the tuning range of the low pass filter and allow a compact realization. The capacitor cell 600 may be included in a capacitor array for one of the capacitors in a low pass filter. Thus, the low pass filter characteristics may be tunable through control of the capacitor cell 600. The capacitor cell 600 may include a capacitor 610, and a switch 620. These elements can be coupled as shown in FIG. 6.

The capacitor 610 may be in the form of a MOS transistor as shown in FIG. 6. The MOS transistor can be configured into a MOS capacitor. For example, a gate terminal G of the MOS transistor can be configured as a first terminal of the capacitor 610, and a source terminal S and a drain terminal D can be shorted and configured as a second terminal of the capacitor 610. The second terminal of the capacitor 610 can be configured as a first terminal Cn of the capacitor cell 600.

The switch 620 may be in the form of a MOS transistor, such as a PMOS transistor as shown in FIG. 6. The MOS transistor can be configured into a MOS switch. For example, a gate terminal G of the MOS transistor can be configured as a switch control, a drain terminal D may be coupled to the first terminal of the capacitor 610, and the source terminal S may be configured as a second terminal Cp of the capacitor cell 600.

During operation, the switch 620 can switch the capacitor 610 in or out of a circuit. In the example of FIG. 6, when the switch control is high, the switch 620 is open, thus the capacitor 610 is switched out of the circuit. When the switch control is low, the switch 620 is closed, thus the capacitor 610 is switched in the circuit.

Additionally, the capacitor cell 600 may be configured to have reduced parasitic parameters. For example, the switch 620 can be a PMOS transistor located in a N-type well, and the capacitor 610 can be a NMOS transistor located in an isolated P-type well. In addition, the P-type well may be located in a deep N-type well. The deep N-type well, the P-type well and the N-type well can be suitably biased to reduce the parasitic parameters.

Figure 7:
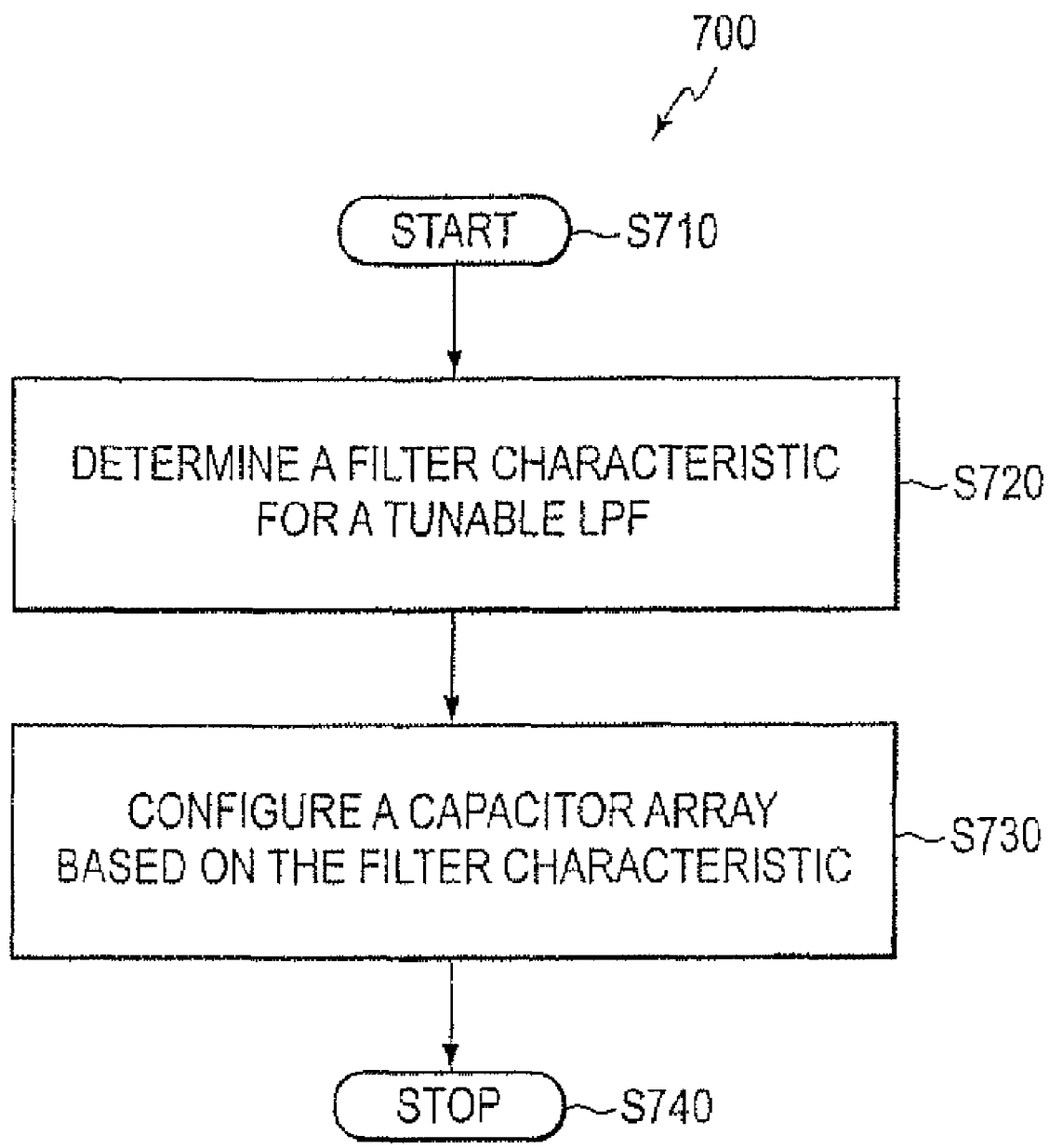
FIG. 7 shows a flow chart outlining a process example for utilizing a tunable low pass filter.

FIG. 7 shows a flowchart outlining a process example for configuring a low pass filter module example according to the disclosure. The low pass filter module can be in any of the configuration as shown in FIG. 3A, FIG. 4, FIG. 5A and FIG. 5B. The low pass filter module may include at least a tunable low pass filter, which can include a MOS transistor, a first capacitor, a second capacitor, and a resistor. At least one of the first capacitor and the second capacitor can be tunable. The process starts at step S710, and proceeds to step S720.

In step S720, a controller, such as the controller 240, may determine a filter characteristic for the tunable low pass filter. In an example, the low pass filter module can be used in a receiver, such as a digital video tuner. The controller may determine a bandwidth characteristic and a shaping characteristic based on a standard for transmitting digital video data. Then, the process proceeds to step S730.

In step S730, the controller may configure a capacitor array based on the filter characteristic. In an example, the tunable low pass filter may include one or more capacitor arrays. Each capacitor array may include multiple capacitor cells. Each capacitor cell may include a capacitor, and a switch that can switch the capacitor in or out. The controller may determine control signals to the switches in the capacitor array to respectively switch in or out the capacitors, such that the tunable low pass filter can have the determined filter characteristic. Then, the process proceeds to step S740, and terminates.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A receiver, comprising:
a first filter stage including at least a low pass filter, the low pass filter having:
a transistor having first, second, and third terminals;
a first capacitor coupled between the second terminal and a ground; and
a second capacitor coupled between the first terminal and the second terminal;
a current source configured to receive filtered current from the first filter stage and relay the filtered current to a second filter stage;
the second filter stage configured to additionally filter the filtered current from the current source; and
a current mirror configured to receive the additionally filtered current from the second filter stage and provide a current signal corresponding to the additionally filtered current.

2. The receiver according to claim 1, wherein the transistor is at least one of a P-type MOS transistor and an N-type MOS transistor.

3. The receiver according to claim 1, wherein at least one of the first capacitor and the second capacitor is tunable via a programmable capacitor array.

4. The receiver according to claim 3, wherein the programmable capacitor array includes at least one capacitor cell having a MOS capacitor in an isolated well.

5. The receiver according to claim 1, further comprising:
a converter coupled to the first filter stage, the converter configured to output a current signal in response to a voltage signal.

6. The receiver according to claim 5, further comprising:
a signal amplifier configured to output the voltage signal in response to a signal received by the receiver.

7. The receiver according to claim 1, wherein the first filter stage further comprises a bias resistor coupled between a DC reference and a capacitor of the low pass filter.

8. The receiver according to claim 7, wherein a product of a resistance of the bias resistor and a trans-conductance of a transistor of the low pass filter is substantially constant.

9. The receiver according to claim 7, wherein the capacitor is a first capacitor, the low pass filter has a transfer function:

$$H(s) = \frac{1}{1 + \frac{C_1 + C_2}{g_{m1}} s + \frac{C_1 C_2 R}{g_{m1}} s^2}$$

wherein $C_1$ is a capacitance of the first capacitor, $C_2$ is a capacitance of a second capacitor of the low pass filter, $g_{m1}$ is a trans-conductance of a transistor of the low pass filter, and R is a resistance of the bias resistor.

10. The receiver according to claim 1, wherein the low pass filter is a first low pass filter, the first filter stage includes at least a second low pass filter configured to stack on the first low pass filter.

11. The receiver according to claim 1, wherein the low pass filter is a first low pass filter, the first filter stage includes at least a second low pass filter configured to form a differential pair with the first low pass filter.

12. The receiver according to claim 11, further comprising:
a coupling capacitor configured to couple across a capacitor of the first low pass filter and a capacitor of the second low pass filter.

13. A method of processing a signal received by a receiver, the method comprising:
receiving a filtered current by a current source from a first filter stage including at least a low pass filter, the low pass filter having:
a transistor having first, second, and third terminals;
a first capacitor coupled between the second terminal and a ground; and
a second capacitor coupled between the first terminal and the second terminal;
relaying the filtered current to a second filter stage;
additionally filtering the relayed current by the second filter stage from the current source; and
receiving the additionally filtered current by a current mirror from the second filter stage to provide a current signal corresponding to the additionally filtered current.

14. The method according to claim 13, wherein the low pass filter is a first low pass filter, the first filter stage includes at least a second low pass filter configured to form a differential pair with the first low pass filter.

15. The method according to claim 13, further comprising:
outputting a voltage signal by a signal amplifier in response to the signal.

16. The method according to claim 15, further comprising:
converting the voltage signal to a current signal.

17. The method according to claim 13, wherein the first filter stage includes a bias resistor coupled between a DC reference and a capacitor of the low pass filter.

18. The method according to claim 13, wherein the low pass filter is a first low pass filter, the first filter stage includes at least a second low pass filter configured to stack on the first low pass filter.

19. The method according to claim 14, wherein a capacitor of the first low pass filter and a capacitor of the second low pass filter is coupled across by a coupling capacitor.

* * * * *